United States Patent
Kelley

(10) Patent No.: US 7,361,016 B2
(45) Date of Patent: Apr. 22, 2008

(54) TEMPERATURE CONTROL ASSEMBLY FOR USE IN ETCHING PROCESSES AND AN ASSOCIATED RETROFIT METHOD

(75) Inventor: Christopher L. Kelley, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 227 days.

(21) Appl. No.: 11/259,471

(22) Filed: Oct. 26, 2005

(65) Prior Publication Data

US 2006/0037705 A1 Feb. 23, 2006

Related U.S. Application Data

(62) Division of application No. 10/737,397, filed on Dec. 15, 2003.

(51) Int. Cl.
*C23F 1/00* (2006.01)
*C23C 16/507* (2006.01)

(52) U.S. Cl. ............... 432/233; 165/201; 165/214

(58) Field of Classification Search ............... 118/724; 156/345.52, 345.5, 345.53; 219/490, 415, 219/209, 390, 416; 432/233, 77, 78, 81; 165/201, 214, 253, 258
See application file for complete search history.

(56) References Cited

U.S. PATENT DOCUMENTS

| | | | |
|---|---|---|---|
| 5,345,534 A * | 9/1994 | Najm et al. ............... 392/422 |
| 5,942,038 A * | 8/1999 | Mayeda et al. ............ 118/719 |
| 6,367,410 B1 * | 4/2002 | Leahey et al. ............. 118/723 |
| 2004/0189218 A1 * | 9/2004 | Leong et al. .............. 315/291 |
| 2005/0126713 A1 * | 6/2005 | Kelley .................... 156/345.53 |
| 2006/0037705 A1 * | 2/2006 | Kelley .................... 156/345.53 |

OTHER PUBLICATIONS

"Applied Centura DPS Etch—DPS Plus for Metal Applications", website http://www.appliedmaterials.com/products/metal_etch_dps_plus_centura.html, printed on Dec. 4, 2003, 1 page.

"Applied Centura DPS Etch—DPS II for Metal Applications", website http://www.appliedmaterials.com/products/metal_etch_dps_ii_centura_300.html, printed on Dec. 4, 2003, 1 page.

(Continued)

*Primary Examiner*—Sylvia R. MacArthur
(74) *Attorney, Agent, or Firm*—Rose Alyssa Keagy; W. James Brady, III; Frederick J. Telecky, Jr.

(57) ABSTRACT

A temperature control assembly for use in etching processes includes a housing, a cooling conduit, fasteners, and a mounting block. The fasteners couple to the housing and operate to associate the cooling conduit, which is formed from a non-corrosive metallic material, with the housing. The mounting block is coupled to the cooling conduit. Also, a method for retrofitting an existing temperature control assembly includes removing an original cooling mechanism, selecting a retrofit cooling conduit formed from a non-corrosive metallic material, coupling fasteners to a housing of the temperature control assembly to associate the retrofit cooling conduit with the housing, and coupling a retrofit mounting block to the retrofit cooling conduit.

9 Claims, 3 Drawing Sheets

OTHER PUBLICATIONS

"Applied Centura DPS Etch—DPS Plus for Silicon Applications", website http://www.appliedmaterials.com/products/silicon_etch_dps_plus.html, printed on Dec. 4, 2003, 1 page.

"Applied Centura DPS Etch—DPS II for Silicon Applications", website http://www.appliedmaterials.com/products/silicon_etch_dps_ii_300.html, printed on Dec. 4, 2003, 1 page.

"Applied Centura eMAX Etch", website http://www.appliedmaterials.com/products/dielectric_etch_emax.html, printed on Dec. 4, 2003, 1 page.

"Applied Centura Enabler Etch", website http://www.appliedmaterials.com/products/dielectric_etch_enabler.html, printed on Dec. 4, 2003, 1 page.

"Applied Centura EnTek Etch—for Dielectric Applications", website http://www.appliedmaterials.com/products/dielectric_etch_emax_entek.html, printed on Dec. 4, 2003, 1 page.

"Applied Producer Etch", website http://www.appliedmaterials.com/products/producer_etch.html, printed on Dec. 4, 2003, 1 page.

"Applied Centura HART Etch for Silicon Applications", website http://www.appliedmaterials.com/products/silicon_etch_hart.html, printed on Dec. 4, 2003, 1 page.

* cited by examiner

TEMPERATURE CONTROL ASSEMBLY FOR USE IN ETCHING PROCESSES AND AN ASSOCIATED RETROFIT METHOD

This is a division of application Ser. No. 10/737,397, filed Dec. 15, 2003, the entire disclosure of which is hereby incorporated by reference.

TECHNICAL FIELD OF THE INVENTION

The present invention relates generally to an etching process chamber assembly and, more particularly, to a temperature control assembly for use in etching processes and an associated retrofit method.

BACKGROUND OF THE INVENTION

Etching processes often operate at high temperatures. Etching process chamber assemblies therefore may include temperature control assemblies that direct heat emitting from heating sources toward etching process chambers. However, because of the high temperatures involved, the temperature control assemblies also heat themselves. A temperature control assembly that overheats may fail or cause other surrounding components to fail.

SUMMARY OF THE INVENTION

In accordance with the present invention, techniques for cooling a temperature control assembly used in etching processes are provided. According to particular embodiments, these techniques include a temperature control assembly that includes a housing, a cooling conduit, fasteners, and a mounting block. According to other embodiments, these techniques include retrofitting an existing temperature control assembly.

According to a particular embodiment, a temperature control assembly comprises a housing, a cooling conduit, fasteners, and a mounting block. The housing has a generally annular cross-section, and it includes an aperture generally disposed along a center axis of the housing and a first side disposed between the aperture and an outside edge of the housing. The first side includes a surface that is generally perpendicular to the center axis. The housing also includes a channel that is disposed through the surface and a second side disposed between the aperture and the outside edge. The second side has a reflective appearance. In addition, the housing includes a plurality of sockets disposed between the surface and the second side, and the sockets are formed to accept a plurality of heating elements. The housing also includes a flange disposed along the first side, and the flange has a plurality of holes arranged substantially to align the temperature control assembly for use in an etching process chamber assembly and to position the second side to face toward a process chamber of the etching process chamber assembly. The cooling conduit is formed from a non-corrosive metallic material and is disposed along a groove created in the first side of the housing. The cooling conduit is also disposed within the channel and adjacent to the aperture. The fasteners couple to the housing and are operable to associate the cooling conduit with the housing. The mounting block is coupled to the cooling conduit.

According to another embodiment, a method for retrofitting a temperature control assembly includes removing an original cooling mechanism from a temperature control assembly. The temperature control assembly comprises a housing, which includes an aperture generally disposed along a center axis of the housing and a first disposed between the aperture and an outside edge of the housing. The first side includes a surface generally perpendicular to the center axis. The housing also includes a channel that is disposed through the surface and a second side disposed between the aperture and the outside edge. The second side has a reflective appearance. In addition, the housing includes a plurality of sockets disposed between the surface and the second side, and the sockets are formed to accept a plurality of heating elements. The housing also includes a flange disposed along the first side, and the flange has a plurality of first holes arranged substantially to align the temperature control assembly for use in an etching process chamber assembly and to position the second side to face toward a process chamber of the etching process chamber assembly. The method also includes creating cavities in the surface adjacent to the channel and drilling and tapping second holes in the cavities. In addition, the method includes creating a groove disposed along the first side and drilling and tapping third holes in the first side adjacent to the groove. The method also includes selecting a retrofit cooling conduit formed from a non-corrosive metallic material and disposing the retrofit cooling conduit along the groove and within the channel. Additionally, the method includes coupling fasteners to the housing using the second holes and the third holes to associate the retrofit cooling conduit with the housing such that the fasteners do not extend past the surface. The method also includes selecting a retrofit mounting block and coupling the retrofit mounting block to the retrofit cooling conduit.

Embodiments of the invention provide various technical advantages. One advantage is a reduction of overheating that causes damage to the temperature control assembly or other surrounding components of an etching process chamber assembly. Another advantage is a reduction of corrosion in cooling conduits that leads to leaking of fluid and resulting damage to the temperature control assembly or other surrounding components of the etching process chamber assembly.

Other technical advantages of the present invention will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE DRAWINGS

Figure 1:
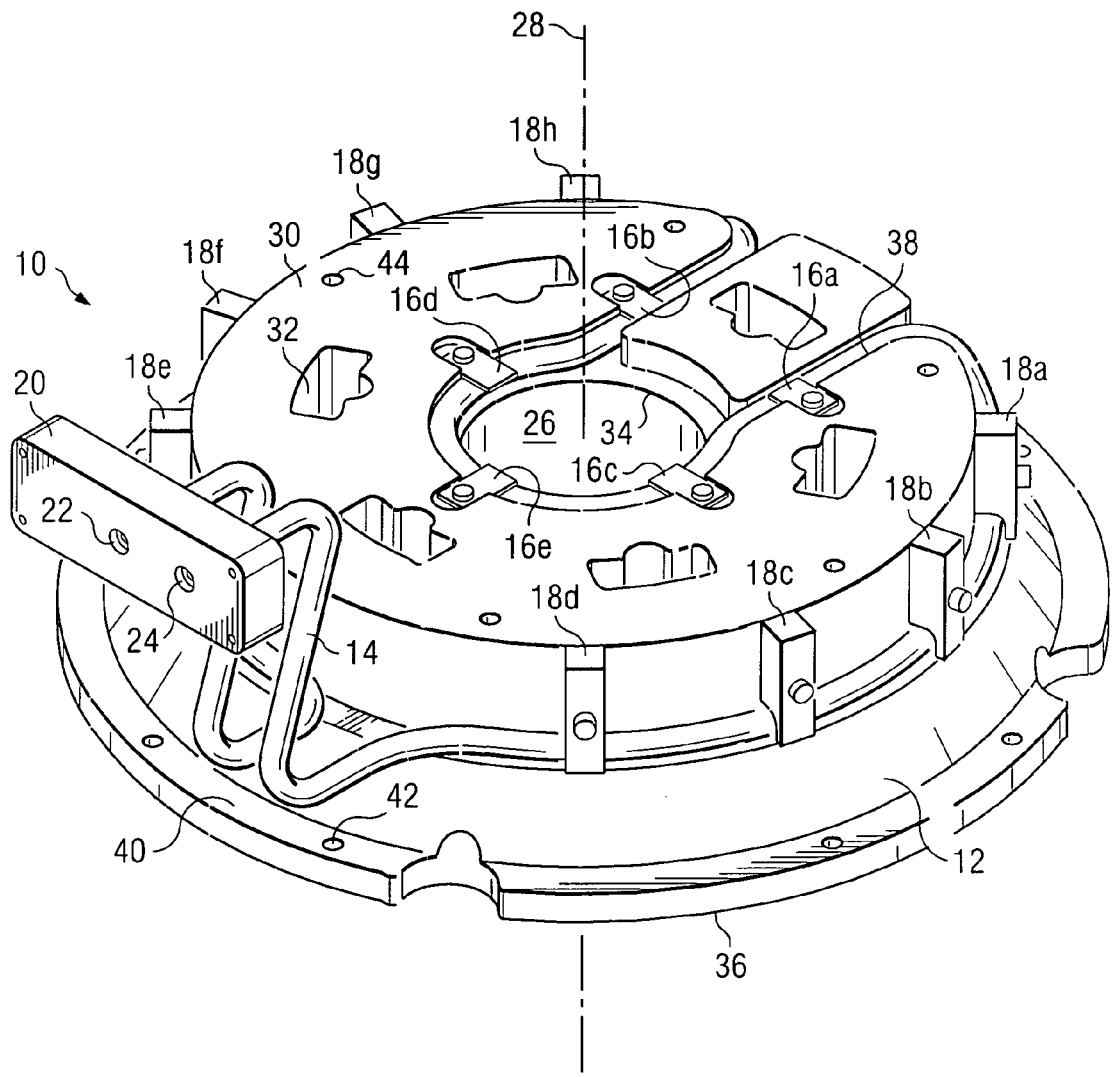
FIG. 1 illustrates a temperature control assembly in accordance with one embodiment of the present invention.

FIG. 1 illustrates a temperature control assembly, indicated generally at 10, in accordance with one embodiment of the present invention. In general, temperature control assembly 10 may be used in an etching process chamber assembly to heat an etching process chamber. The temperature of the etching process chamber may be adjusted or controlled, for example, by adjusting or controlling the current of electricity flowing through heating elements directed toward the etching process chamber by temperature control assembly 10. However, because of the high temperatures involved, heat may need to be removed from temperature control assembly 10 itself. According to particular embodiments, temperature control assembly 10 may couple to fluid lines (not shown) and use fluid to extract heat from temperature control assembly 10. A paradigmatic example of an etching process chamber assembly of the sort in which temperature control assembly 10 might be used is Applied Materials' "Centura DPS" line of metal etching process chamber assemblies used in semiconductor manufacturing.

Now discussing temperature control assembly 10 in more detail, temperature control assembly 10 includes a housing 12, a cooling conduit 14, a plurality of first fasteners 16, a plurality of second fasteners 18, and a mounting block 20.

Housing 12 includes an aperture 26 that is generally disposed along a center axis 28 of housing 12. Housing 12 also includes a surface 30 that is generally perpendicular to center axis 28. Surface 30 includes a plurality of sockets, for example socket 32, formed to accept a plurality of heating elements, such as light bulbs or other heat emitting sources. Housing 12 also includes an inside edge 34 formed by aperture 26 and an outside edge 36.

Aperture 26 may operate to allow temperature readings of the etching process chamber to be taken. Such temperature readings may be taken, for example, by infrared temperature sensors sending infrared rays through aperture 26 to reflect off of the etching process chamber and back through aperture 26. Temperature readings may be useful in controlling the temperature of the etching process chamber. For example, in response to temperature control readings, a controller may adjust current provided to heating elements held in place by temperature control assembly 10. However, if unaccounted for, heat generated by increasing current provided to heating elements can lead to failure of temperature control assembly 10 or other system components. Therefore, temperature control assembly 10 includes cooling conduit 14 to regulate the temperature of temperature control assembly 10.

Cooling conduit 14 is disposed along housing 12 and within a channel 38. Along housing 12, cooling conduit 14 may be disposed along a groove machined into housing 12. This groove may be created by milling housing 12, and the groove may have a radius substantially equal to the radius of cooling conduit 14. Within channel 38, cooling conduit 14 passes through surface 30 and generally encircles aperture 26 adjacent to inside edge 34.

Cooling conduit 14 is operable to remove heat from housing 12 with the use of a fluid that flows through cooling conduit 14. The fluid enters cooling conduit 14 at first end 22 and then flows through cooling conduit 14. The fluid travels along housing 12 and channel 38 until the fluid exits cooling conduit 14 at second end 24. The fluid in cooling conduit 14 naturally increases in temperature while flowing through cooling conduit 14 from first end 22 to second end 24 as it removes heat from temperature control assembly 10.

Fluid flowing through cooling conduit 14 may be any suitable type of fluid. According to particular embodiments, the fluid may be natural water or de-ionized water. However, water flowing through cooling conduit 14 may operate to corrode cooling conduit 14, particularly when cooling conduit 14 is formed of a material susceptible to corrosion, such as aluminum. In these circumstances, the fluid that flows through cooling conduit 14 may etch and thin the walls of cooling conduit 14, ultimately resulting in a leak.

To avoid leaks due to corrosion, cooling conduit 14 may be formed of a non-corrosive material that is substantially resistant to corrosive properties of the fluid used. For example, cooling conduit 14 may be made of a metal such as copper or stainless steel. Copper provides good thermal conductivity and may be less expensive than aluminum. Furthermore, copper has good mechanical properties and does not corrode as easily as other metals such as aluminum. Similarly, stainless steel does not corrode as easily as aluminum.

According to particular embodiments, housing 12 is formed of machined aluminum. If housing 12 and cooling conduit 14 are formed from dissimilar metals, however, it may be difficult to solder or weld housing 12 and cooling conduit 14 together. In these situations, first fasteners 16 and second fasteners 18 operate to associate housing 12 with cooling conduit 14. First fasteners 16 and second fasteners 18 may be coupled to housing 12 in any of various ways including but not limited to screws, bolts, glue, weld, and solder.

Precautions may need to be taken when associating housing 12 with cooling conduit 14. For example, surface 30 may need to couple to another component of the etching process chamber assembly in a flush manner. Thus, cavities may need to be formed in surface 30 to allow first fasteners 16 to associate cooling conduit 14 with housing 12 without extending past surface 30. Second fasteners 18 may also be positioned so that any particular second fastener 18, such as second fastener 18a, does not extend past surface 30.

Furthermore, to better associate cooling conduit 14 with housing 12 and to provide increased thermal conductivity, other steps may be taken. For example, the cavities may be formed such that the vertical distance between the bottom of the cavities and the bottom of channel 38 is less than the vertical distance between the top of cooling conduit 14 as it rests in channel 38 and the bottom of channel 38. Also, second fasteners 18 may include curved surfaces to engage the outside surface of cooling conduit 14, and these curved surfaces may have a smaller radius than the radius of cooling conduit 14. In these manners, first fasteners 16 and second fasteners 18 may apply increased pressure to cooling conduit 14, pressing cooling conduit 14 to housing 12 in order to provide for increased heat transfer between housing 12 and cooling conduit 14. In addition, thermally conductive grease may be applied between cooling conduit 14 and housing 12.

Cooling conduit 14 is also coupled with mounting block 20 at a first end 22 of cooling conduit 14 and a second end 24 of cooling conduit 14. Mounting block 20 is operable to couple temperature control assembly 10 to another component of the etching process chamber assembly, such as a fluid supply and removal assembly. Mounting block 20 may be formed of various materials including but not limited to aluminum, copper, and brass. When mounting block 20 and cooling conduit 14 are formed from suitable materials, they may be coupled using welding or soldering. For example, when cooling conduit 14 is made of copper, it may be useful to form mounting block 20 of brass or copper in order to couple cooling conduit 14 and mounting block 20 using a weld or a solder.

To couple temperature control assembly 10 to another component of the etching process chamber assembly, such as a process chamber of the etching process chamber assembly, temperature control assembly 10 includes a flange 40. Flange 40 includes a plurality of mounting holes 42 formed to accept fastening devices such as screws or bolts.

Figure 2:
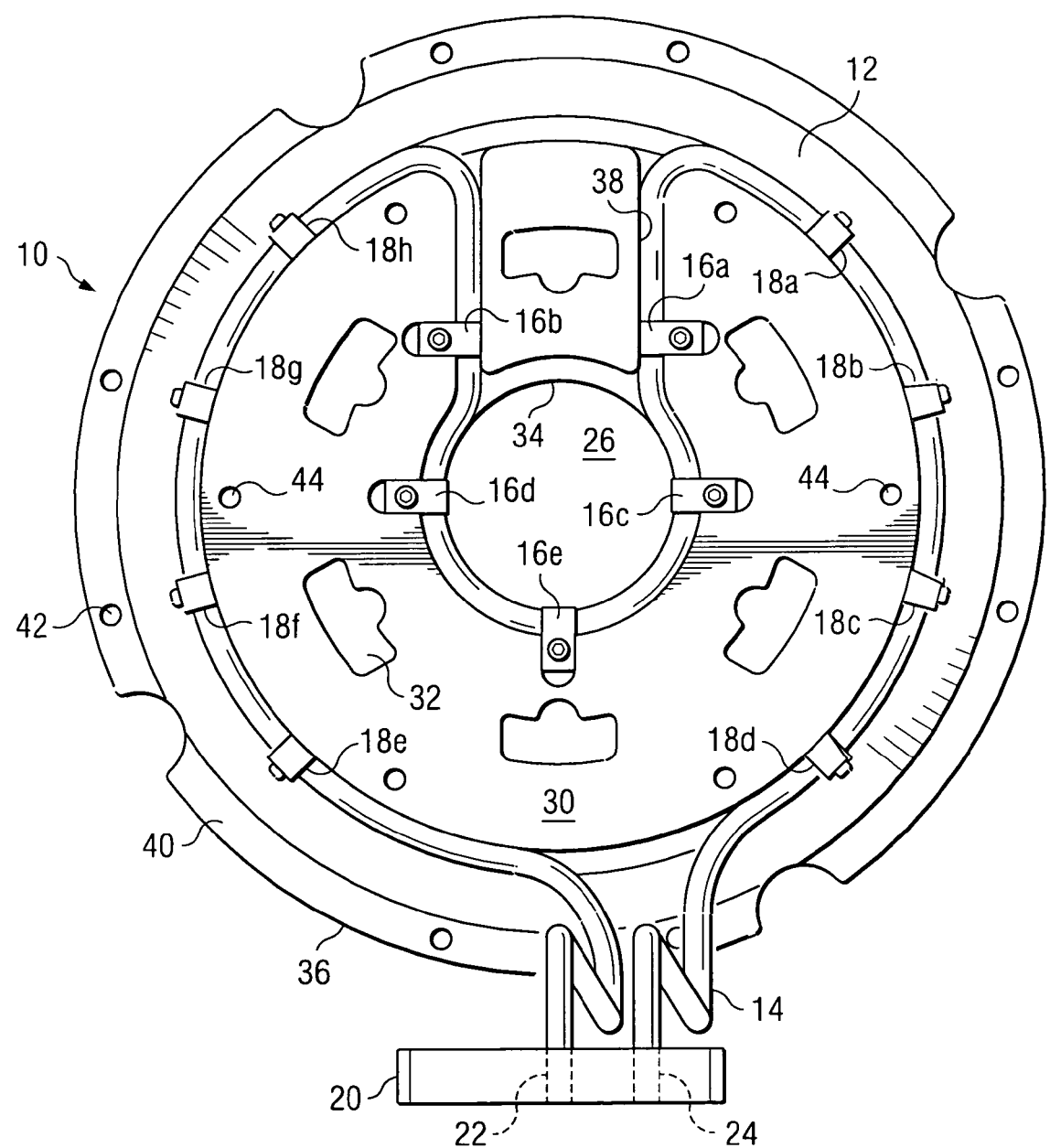
FIG. 2 is a top view of the temperature control assembly illustrated in FIG. 1.

FIG. 2 is a top view of temperature control assembly 10 showing one side of temperature control assembly 10. On the opposite side, temperature control assembly 10 may have a reflective appearance to focus heat on the process chamber.

First fasteners 16 are operable to associate cooling conduit 14 with housing 12 within channel 38. Channel 38, formed in surface 30, allows cooling conduit 14 to pass through surface 10 and generally to encircle aperture 26 adjacent to inside edge 34. First fasteners 16, when associated with housing 12, may extend over channel 38 and operate to clamp cooling conduit 14 into channel 38. First fasteners 16 may be coupled to housing 12, for example by screws or bolts coupled to housing 12.

Second fasteners 18 are also operable to associate cooling conduit 14 with housing 12. Second fasteners 18, positioned around housing 12, allow cooling conduit 14 generally to encircle housing 12. Furthermore, as discussed above, housing 12 may include a groove created in housing 12 along which cooling conduit 14 may be disposed. Similarly to first fasteners 16, second fasteners 18 may be coupled to housing 12, for example by screws or bolts coupled to housing 12.

Figure 3:
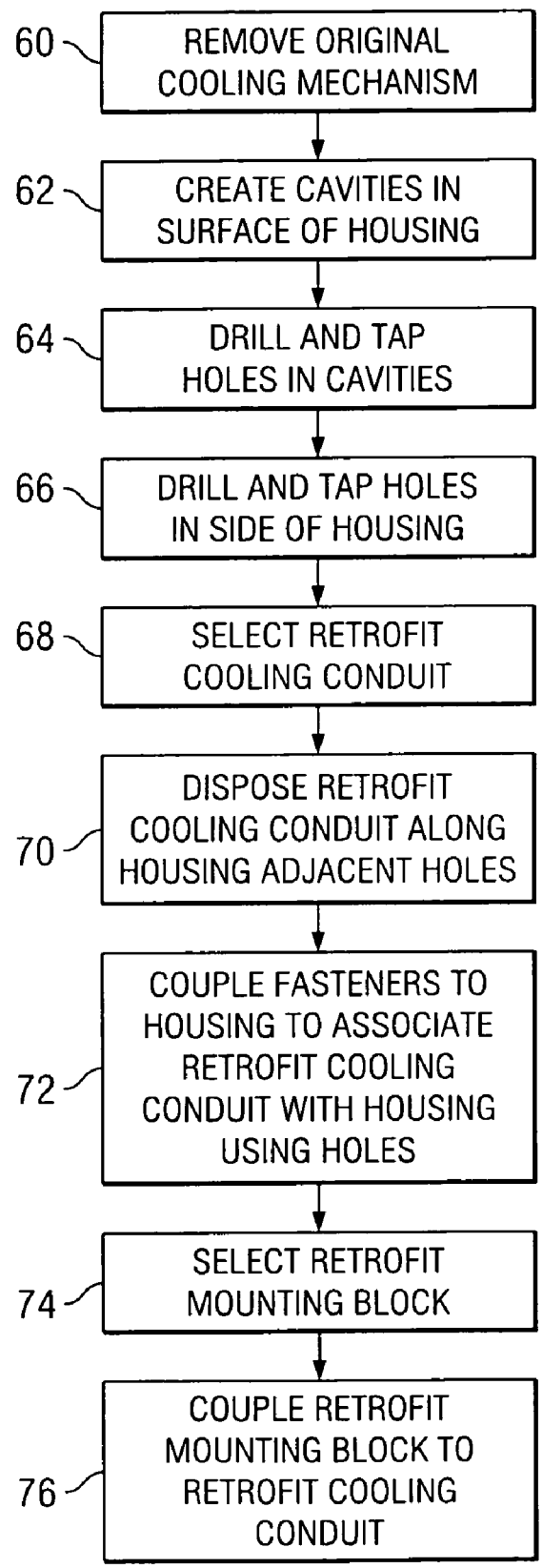
FIG. 3 is a flowchart illustrating a method for retrofitting a temperature control assembly.

FIG. 3 is a flowchart illustrating a method for retrofitting an existing temperature control assembly to provide a cooling assembly as detailed above. An existing temperature control assembly may be retrofitted to resemble temperature control assembly 10. For example, a retrofit method may be used for the temperature control assembly supplied with Applied Materials' "Centura" line of metal etching process chamber assemblies.

Now discussing FIG. 3 in more detail, at step 60, an original cooling mechanism is removed from an original temperature control assembly. Removal may occur using various mechanical methods, including machining an original temperature control assembly to disassociate the original cooling mechanism from the original temperature control assembly. This or other machining may create a groove in a housing of the original temperature control assembly.

At step 62, a plurality of cavities are created in a surface of the housing of the original temperature control assembly. These cavities may operate to provide clearance so that a retrofit cooling conduit may be associated with the housing in a manner that does not disrupt the flushness of any connection between the housing and any other component of the original temperature control assembly. At step 64, a plurality of first holes may be drilled and tapped into the plurality of cavities. At step 66, a plurality of second holes also may be drilled and tapped into the housing, and these holes may be located next to the groove.

At step 68, a retrofit cooling conduit is selected. As mentioned previously, copper and stainless steel provide desirable mechanical and thermal properties and therefore a retrofit cooling conduit made of these materials may be used.

At step 70, the retrofit cooling conduit is disposed along the housing adjacent to first and second holes, and it may be disposed along the groove and within a channel formed in the housing. For example, the retrofit cooling conduit may be disposed along the housing by bending material to resemble cooling conduit 14, which has been shown and discussed previously with regard to FIGS. 1 and 2.

At step 72, the retrofit cooling conduit is associated with the housing using the first and second holes. Associating the retrofit cooling conduit with the housing includes any manner of holding the retrofit cooling conduit substantially in contact with the housing.

As shown and discussed previously with regard to FIGS. 1 and 2, fasteners may be used to associate the retrofit cooling conduit with the housing. First fasteners 16 and second fasteners 18 may operate to press cooling conduit 14 to housing 12 in order to provide for heat transfer between housing 12 and cooling conduit 14. For associating the retrofit cooling conduit with housing 12 in channel 38, first fasteners 16 may be placed in the cavities to maintain a flush connection between surface 30 and any component coupled to temperature control assembly 10 at surface 30. First holes drilled and tapped into these cavities are operable to couple first fasteners 16 to housing 12. For associating the retrofit cooling conduit with housing 12 outside channel 38, second holes may be drilled and tapped in other areas of housing 12 and may be operable to couple second fasteners 18 to housing 12. First and second fasteners may be coupled to housing 12, for example, using screws or bolts.

At step 74, a retrofit mounting block is selected. Although not necessary, it is often advantageous to select a mounting block of the same or complementary composition as the retrofit cooling conduit. For example, if the retrofit cooling conduit is made of copper, a copper or brass retrofit mounting block may be selected in order to more easily couple the retrofit mounting block and the retrofit cooling conduit.

The retrofit mounting block and the retrofit cooling conduit are coupled at step 76. Coupling may occur by soldering, welding, fitting, or otherwise associating the retrofit mounting block with the retrofit cooling conduit. However, if the retrofit mounting block and the retrofit cooling conduit are formed of the same or complementary material, like brass and copper respectively, soldering the retrofit mounting block and the retrofit cooling conduit together may be appropriate.

While this flowchart illustrates a method containing specific steps in a particular order, temperature control assembly 10 contemplates many of the steps in this flowchart taking place simultaneously and/or in different orders than as shown. Moreover, temperature control assembly 10 contemplates retrofit methods containing additional steps, fewer steps, and different steps so long as the methods remain appropriate for retrofitting an existing temperature control assembly to resemble temperature control assembly 10.

Although the present invention has been described in several embodiments, a myriad of changes and modifications may be suggested to one skilled in the art and it is intended that the present invention encompass such changes and modifications as fall within the scope of the present appended claims.

What is claimed is:

1. A method for retrofitting a temperature control assembly, comprising:

removing an original cooling mechanism from a temperature control assembly, the temperature control assembly comprising a housing and wherein the housing comprises:

an aperture generally disposed along a center axis of the housing;

a first side disposed between the aperture and an outside edge of the housing and including a surface generally perpendicular to the center axis; a channel disposed through the surface;

a second side disposed between the aperture and the outside edge and having a reflective appearance;

a plurality of sockets disposed between the surface and the second side and formed to accept a plurality of heating elements; and a flange disposed along the first side and having a plurality of first holes arranged substantially to align the temperature control assembly for use in an etching process chamber assembly and to position the second side to face toward a process chamber of the etching process chamber assembly;

creating a plurality of cavities in the surface adjacent to the channel; drilling and tapping a plurality of second holes in the plurality of cavities; creating a groove disposed along the first side;

drilling and tapping a plurality of third holes in the first side adjacent to the groove;

selecting a retrofit cooling conduit formed from a non-corrosive metallic material;

disposing the retrofit cooling conduit along the groove and within the channel and disposing said cooling conduit to generally encircle the aperture;

coupling a plurality of fasteners to the housing using the second holes and the third holes to associate the retrofit cooling conduit with the housing such that the fasteners do not extend past the surface;

selecting a retrofit mounting block; and coupling the retrofit mounting block to the retrofit cooling conduit.

2. The retrofitting method of claim 1, wherein removing the original cooling mechanism from the temperature control assembly comprises machining the temperature control assembly to disassociate the original cooling mechanism from the temperature control assembly.

3. The retrofitting method of claim 1, wherein the groove has a radius substantially equal to the radius of the cooling conduit.

4. The retrofitting method of claim 1, wherein creating the plurality of cavities in the surface adjacent to the channel comprises machining the plurality of cavities into the surface.

5. The retrofitting method of claim 1, wherein the plurality of fasteners comprises:

a plurality of first fasteners disposed within the plurality of cavities, wherein the vertical distances between the bottoms of the cavities and the bottom of the channel are less than the vertical distance between the top of the cooling conduit as it rests in the channel and the bottom of the channel, such that that when coupled to the housing the plurality of first fasteners associates the cooling conduit with the housing by clamping the cooling conduit within the channel; and a plurality of second fasteners that include curved surfaces that engage the outside surface of the cooling conduit, the curved surfaces having shorter radii than the outside surface, such that when coupled to the housing the plurality of second fasteners associates the cooling conduit with the housing by clamping the cooling conduit against the housing.

6. The retrofitting method of claim 1, wherein the non-corrosive metallic material is copper.

7. The retrofitting method of claim 1, wherein the non-corrosive metallic material is stainless steel.

8. The retrofitting method of claim 1, wherein the retrofit mounting block is formed from a metal complementary to the non-corrosive metallic material.

9. The retrofitting method of claim 8, wherein coupling the retrofit mounting block to the retrofit cooling conduit comprises soldering the retrofit mounting block and the retrofit cooling conduit.

* * * * *